United States Patent
Willshere et al.

[11] Patent Number: 5,815,912
[45] Date of Patent: Oct. 6, 1998

[54] CIRCUIT BOARD SUPPORT ASSEMBLY

[75] Inventors: Jeffery Richard Willshere, Weymouth; Trevor Martin Ruddock, Wimborne, both of England

[73] Assignee: Smtech Limited, Dorchester Dorset, England

[21] Appl. No.: 745,082

[22] Filed: Nov. 7, 1996

[51] Int. Cl.⁶ .................................................. B23P 21/00
[52] U.S. Cl. ................................. 29/721; 29/760; 29/785
[58] Field of Search ............................ 29/739, 721, 760, 29/785, 793; 198/470.1, 678.1, 465.4

[56] References Cited

U.S. PATENT DOCUMENTS

| | | | |
|---|---|---|---|
| 3,731,866 | 5/1973 | Mason et al. ........................ | 29/739 X |
| 4,399,988 | 8/1983 | De Shong ............................. | 29/760 X |
| 4,408,753 | 10/1983 | Chapman et al. .................... | 29/744 X |
| 4,616,410 | 10/1986 | Stokoe et al. ........................ | 29/760 X |
| 5,172,468 | 12/1992 | Tanaka et al. ........................ | 29/721 |
| 5,218,753 | 6/1993 | Suzuki et al. ........................ | 29/760 X |
| 5,590,455 | 1/1997 | Kato et al. ........................... | 29/739 X |

*Primary Examiner*—Peter Vo
*Assistant Examiner*—Rick Kiltae Chang
*Attorney, Agent, or Firm*—Notaro & Michalos P.C.

[57] ABSTRACT

A circuit board locating assembly for locating a circuit board during a manufacturing operation such as a solder paste printing operation performed on the board, the locating assembly comprising a tooling platen for supporting during the operation a plurality of individual board support means, a magazine for storing the board support means when the board support means are removed from the area in which the board is supported during the operation, and conveying means adapted to convey the board support means from the magazine and to position the board support means in selected positions on the tooling platen.

10 Claims, 3 Drawing Sheets

CIRCUIT BOARD SUPPORT ASSEMBLY

BACKGROUND OF THE INVENTION

The present invention relates to circuit board manufacturer and particularly, but not exclusively, to solder paste printers.

Solder paste printers are used primarily to provide a solder paste pattern for surface mount components. In a solder paste printer solder paste is screen printed through a stencil, a squeegee assembly being employed to force solder paste through the stencil apertures, and to ensure that the deposited layer is of uniform thickness.

It is important to hold the circuit board substantially flat during the printing operation, despite the substantial pressures which may be generated by the squeegee assembly.

Other operations in which the board is desirably held flat and to which the invention relates are, for example, inspection of a solder paste pattern, and component pick and place operations In order to accommodate electrical components which may already be mounted on the underside of the circuit board it is known to support the circuit board during solder paste printing on a plurality of spaced-apart support pins, which are suitably positioned to avoid interfering with those components.

In one known arrangement the support pins are retractable pins which work through holes provided in predetermined positions in a tooling platen.

We consider that it would be advantageous to be able automatically to change the layout of the support pins in order quickly to accommodate changes in boards during a production run. To this end the present invention provides a support-pin handling system for automatically handling support-pins or other discrete board support means.

According to the invention we provide a circuit board locating assembly for locating a circuit board during a manufacturing operation performed on the board, the locating assembly comprising a tooling platen for supporting during the operation a plurality of individual board support means, a magazine for storing the board support means when the board support means are removed from the area in which the board is supported during the operation, and conveying means adapted to convey the board support means from the magazine and to position the board support means in selected positions on the tooling platen.

The board support means may be rigid or may be arranged to provide a predetermined degree of compliance.

The conveying means is preferably reversible to return the support means from the tooling platen to the magazine when a change in the positions of the support means is required to accommodate a change in board.

The board support means preferably comprise a base containing magnetic means for holding the base in the required position on the tooling platen, the base supporting an upstanding pin which is engaged with the underside of a board during a solder paste printing operation.

The magazine is preferably in the form of a carousel.

In order to avoid conveying the support means over the margin of the tooling platen, which would obstruct the margin, the support means are preferably conveyed through an aperture or cut-out in the tooling platen, preferably by means of a piston and cylinder assembly of the conveying means, the piston and cylinder assembly being adapted to lift a support means from the carousel and through the tooling platen aperture, the platen overlapping with the carousel.

The conveying means preferably additionally comprises a pick and place means adapted to accept a support means from the piston and cylinder assembly and to place the support means in a selected position on the tooling platen, where the support means is retained by the magnetic means. The pick and place means preferably comprises an x,y carriage.

When the operation performed is a solder paste printing or inspection operation, the pick and place means is conveniently provided by a roving camera head. Such a roving camera head can enable a stencil to be aligned with a circuit board prior to the solder paste printing operation.

The camera head is preferably provided with a releasable holding means for gripping a support means, to enable a support means to be taken from the piston and cylinder assembly and then to be conveyed to a selected position on the tooling platen prior to release by the holding means.

When a roving camera is provided the camera may be utilised to monitor the position of the support means on the platen once the support means have been placed, in case the support means get moved slightly on repeated application to boards.

A record of the x,y co-ordinates of support means can be maintained which may be used, for example, to enable the pick and place means to engage with a support means when the support means is to be returned to the magazine.

The monitoring operation is preferably arranged to be performed during unloading of one board and loading of the subsequent board. The monitoring operation is facilitated by measuring the position of one support means only during each board change.

The camera may also be utilised to map the x,y positions of support means should an operator decide to place the support means manually on the platen.

The camera can be arranged to search the operative area of the platen to locate the support means and to store this information. The stored information may then be used on subsequent occasions as the basis for automatic placement of the support means in the usual way.

A solder paste printing assembly in accordance with the invention will now be described, by way of example only, with reference to the accompanying drawings in which:

DETAILED DESCRIPTION OF THE PEREFERRED EMBODIMENTS

Figure 1:
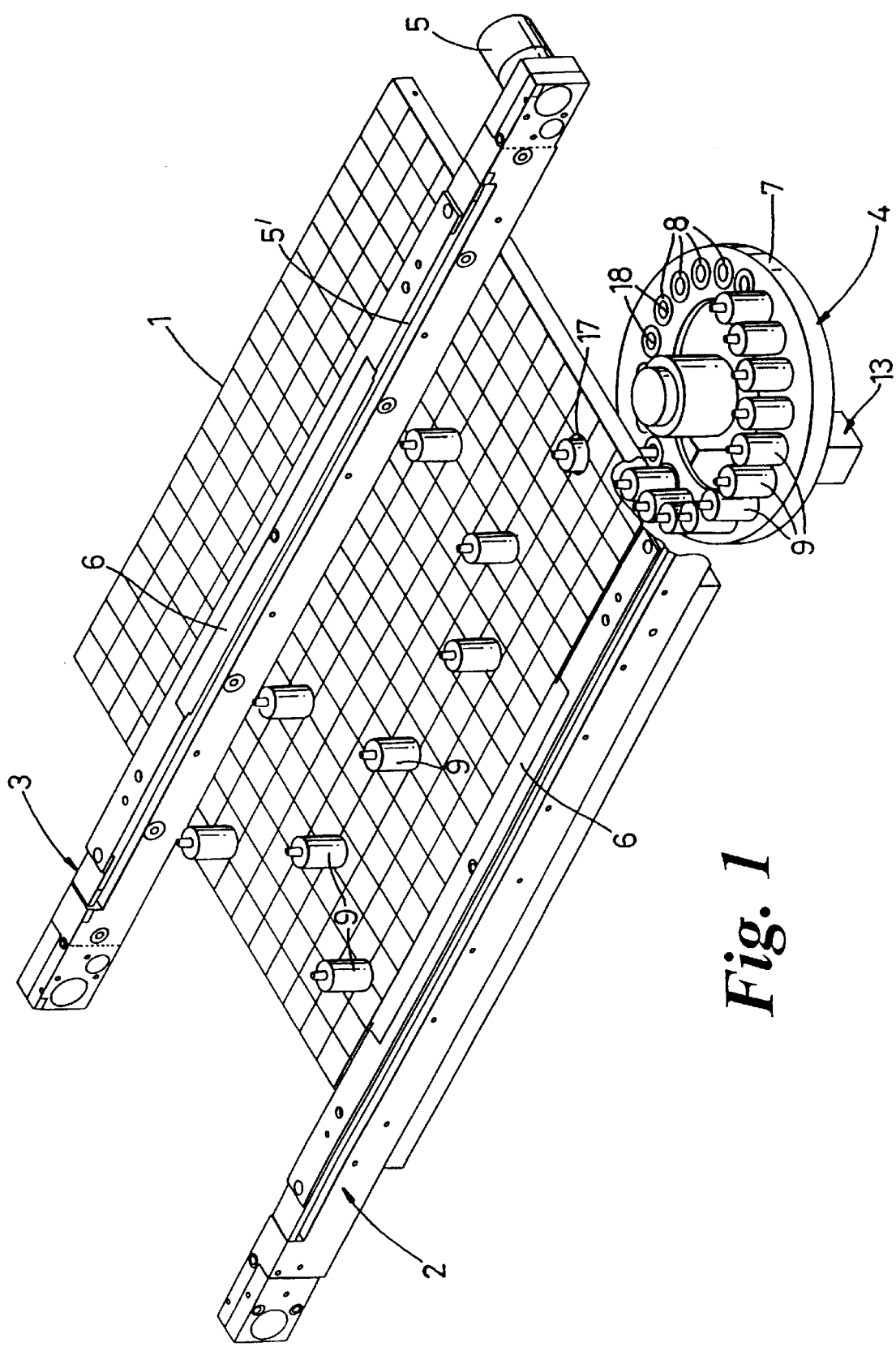
FIG. 1 is a perspective view of the tooling platen, board conveyors and tooling pin carousel of the printing assembly.
Figure 2:
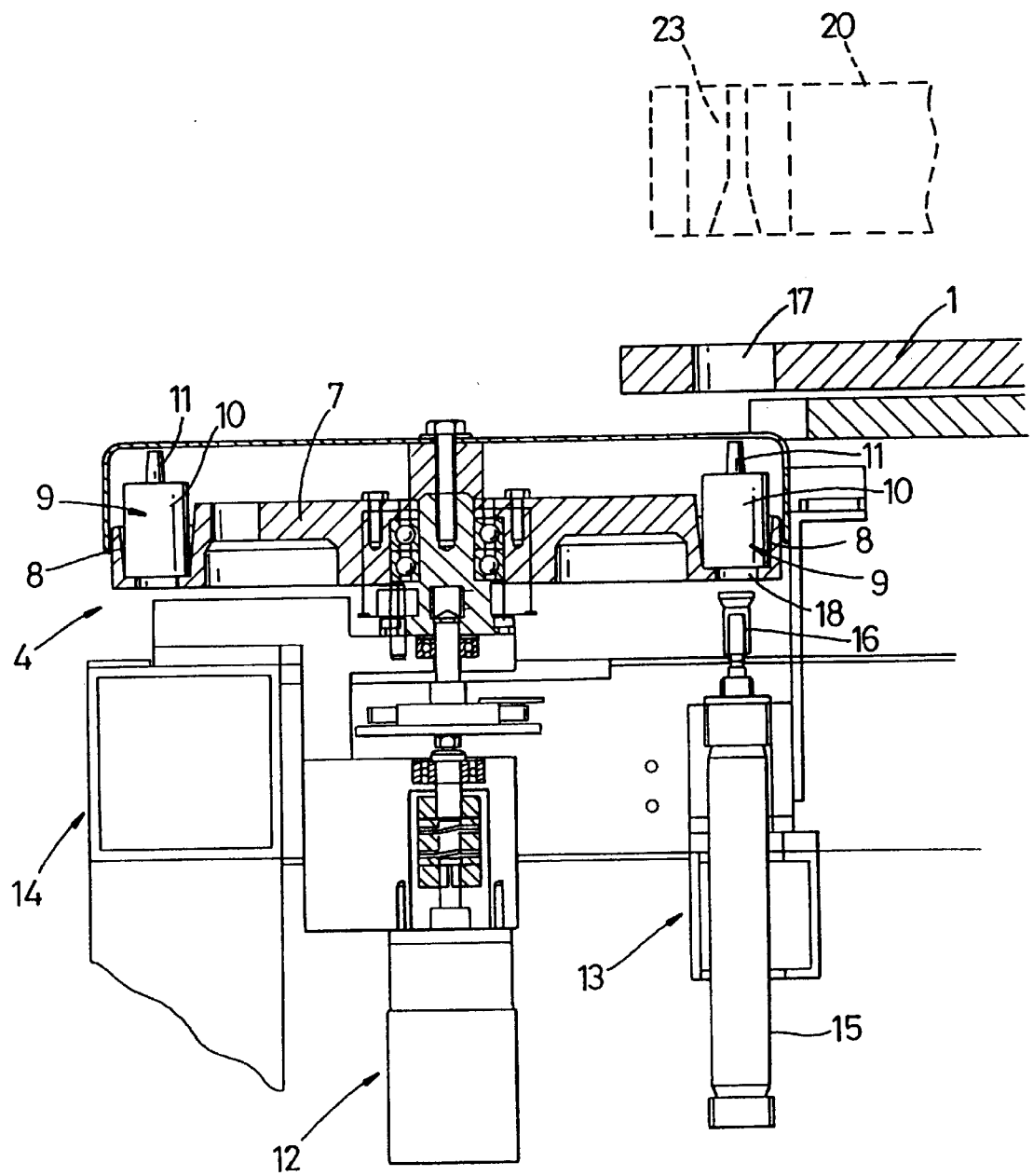
FIG. 2 is a vertical cross-section through the carousel and through the margin of the tooling platen of FIG. 1, to show the piston and cylinder assembly for lifting tooling pins through an aperture in the tooling platen.

With reference to FIG. 1, a rectangular tooling platen 1 in the form of a plate of ferro-magnetic metal is supported in known manner, not shown, for vertical movement relative to a machine frame 14, FIG. 2. A pair of parallel board conveyers 2, 3 are supported above the platen 1, the front end of conveyor 2 having been cut-away in FIG. I together with the front corner of platen 1 to show the underlying carousel 4.

The conveyors 2, 3 are provided with respective drive motors 5 which drive a respective friction belt 5¹ for carrying a board from one end of the conveyors 2, 3 to an intermediate longitudinal position where the opposite margins of the board can be clamped by elongate clamping foils 6 during the solder paste printing operation. After the printing operation is complete foils 6 are released, and the board is conveyed away.

The front conveyor 2 is fixed in position relative to the machine frame, whereas the rear conveyor 3 is adjustable in position towards and away from conveyor 2 to accommodate boards of different widths.

Figure 3:
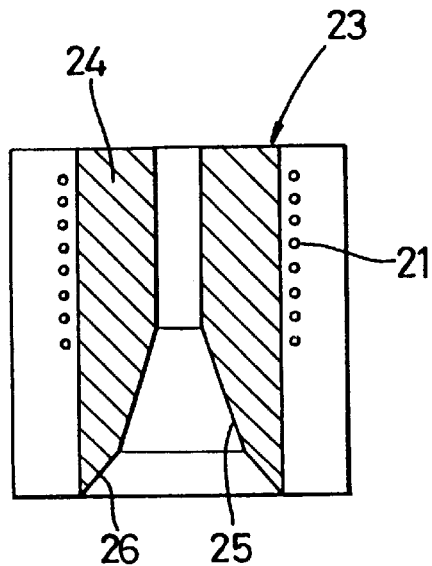
FIG. 3 is a schematic vertical cross-section of a support means for use in the assembly of FIG. 1.

As shown in FIG. 2, the carousel 4 comprises a carousel disc 7 which is formed with twenty circumferentially equally-spaced cylindrical pockets 8 to accommodate respective board support means in the form of tooling pins 9. The tooling pins 9, FIG. 3, each comprise a cylindrical body 10 and a coaxial upwardly directed support pin 11, the body 10 housing a permanent magnet 22.

A double-acting pneumatic piston and cylinder assembly 13 comprises a cylinder 15 and a piston rod 16 which is in register with the circular aperture 17 in platen 1. The carousel disc 7 is formed with vertical holes 18 leading into the base of the respective pockets 8 to enable the piston rod 16 to be projected into and through a pocket 8 which has been positioned in register with the piston and cylinder assembly 13, thereby lifting the relevant tooling pin 9 out of the respective pocket 8 and through the aperture 17 in the platen to a datum position at which the tooling pin 9 can be captured by a pick and place means.

Figure 4:
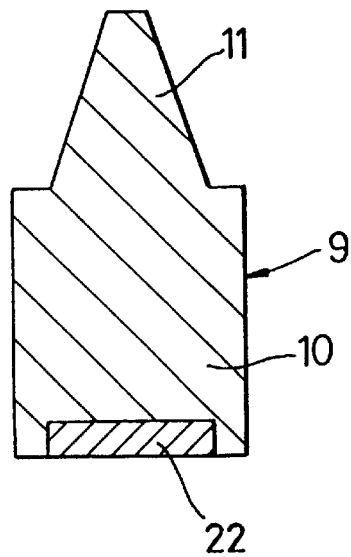
FIG. 4 is a schematic vertical cross-section of a pick-up unit carried by the roving camera head.

The pick and place means comprises a video camera head 20 which is mounted on an x,y carriage supported above the conveyors 2, 3 on a pivotally retractable framework mounted on machine frame 14. The camera head 20 is provided primarily to provide in use pictures on a VDU screen of the relative x,y positions of a board when held by foils 6 and of a stencil to be employed in screen printing of a solder paste on the board, to enable the relative x,y positions to be adjusted such that the stencil when applied to the upper surface of the board will be in the desired position. The camera head is capable of roving over the entire are of the platen 1, the camera head thereby providing a convenient mounting for a tooling pin holder 23, FIG. 4, comprising an electromagnetic coil 21, FIG. 4, which can be used to suspend one of the tooling pins 9 in order to convey the tooling pin 9 from the datum position above aperture 17 to a desired x,y position just above platen 1, whereupon the electromagnet is de-energised to allow that tooling pin 9 to contact platen 1. The permanent magnet 22 in the released support means 9 will cause that support means to be affixed to platen 1.

Tooling pin holder 23 comprises an annular iron core 24 formed with a frusto-conical bore portion 25 complementary to the shape of pin 11, and a frusto-conical lead-in portion 26 of wider cone angle.

It will be appreciated that the accuracy required for x,y movement of the camera head is being utilised by the pick and place function, so this avoids the need for any additional pick and place mechanism.

Once a tooling pin 9 has been positioned and released onto the platen 1 by the camera head, the camera head is returned to the position above aperture 17 to pick up the next tooling pin 9 which by then has been raised above aperture 17 to the datum position, the carousel disc 7 having been indexed following downwards retraction of the piston rod 16.

It will be appreciated that this procedure is repeated until the desired number of tooling pins have been fed from the carousel and positioned on the platen 1. A board to be printed can then be supplied to the conveyors 2, 3 to be conveyed into the clamping position, whereupon the platen 1 is raised relative to the frame 4 to bring the tooling pins 9 on the platen into contact with the underside of the clamped board.

On setting up a new product, the required tooling pin 11 x,y positions relative to platen 1 are programmed automatically from the board file information, or the operator programs tooling positions using a light pen or by entering data into an x,y co-ordinate table form. On command, the machine translates the information into real world table co-ordinates and starts to position the tooling pins one by one from the carousel disc 7. When a new board file is selected all support means 9 are returned to the carousel. The support means 9 are sensed back into the carousel. If a support means 9 is not sensed then the machine is arranged to abort the tooling function and the operator must load the carousel without the use of the roving camera head. Once all pins are accounted for it is arranged that a new tooling cycle can be initiated.

Drive and positional control of the carousel disc 7 is achieved using a geneva mechanism and DC motor drive 12. Care is taken to match the pin index time with the expected average tact time of the x,y carriage.

Flow restrictors regulate the piston and cylinder 13 speeds in both directions. The cylinder is controlled using a five port two-position 24v DC solenoid valve. Proximity sensors are required to sense cylinder home and away positions thus ensuring that indexing of disc 7 does not take place with the piston rod 16 in a potential crash position.

Various sensors, not shown, are required.

A support means sensor is required to:

a) count the number of support means entering and leaving the carousel, and b) to indicate that the support means has been successfully transferred from the carousel to the camera head.

An index sensor is required to show that the stepper drive of disc 7 has indexed to the correct position and to indicate that the piston rod 16 can be projected.

An initialisation sensor is required to index the carousel to the home position thereof.

Suitable software is provided to control the camera head in executing the pick and place operations. This can be based on CAD/GERBA data etc, relating to the board layout. The software can in known manner optimise the tooling pickup path so that the time taken to place support means is kept to a minimum and any no-go areas for tooling placement are avoided.

Example of a machine specification:

| | |
|---|---|
| Number of programmable support means | 20 |
| Placement Area | Full board covering 360 mm × 420 mm |
| Change over cycle time | 3 minutes for 20 pins evenly distributed across 360 mm × 420 mm |

We claim:

1. A circuit board support assembly for supporting a circuit board during an operation performed on the board, the support assembly comprising:

(a) a tooling platen;

(b) an aperture in the tooling platen;

(c) a magazine positioned below the tooling platen, the magazine having a plurality of pockets, the pockets for retaining removable support means, one of the pockets vertically aligned with the aperture;

(d) a piston and cylinder assembly positioned below the magazine, the piston and cylinder assembly having a cylinder and a piston rod, the cylinder vertically aligned with the aperture in the tooling platen, the piston rod movably mounted to the cylinder, the piston rod movable in a longitudinal direction for extending through the pocket in the magazine and lifting the support means from the pocket through the aperture in the tooling platen; and (e) a conveying means for conveying the support means from the aperture to a position on the tooling platen.

2. The circuit board support assembly as claimed in claim 1 in which the magazine is a carousel.

3. The circuit board support assembly as claimed in claim 2 in which the carousel has twenty circumferentially equally-spaced cylindrical pockets.

4. The circuit board support assembly as claimed in claim 1, in which the support means comprises:

(a) a cylindrical body;

(b) a pin extending upward from the cylindrical body, the pin having a conical shape and a flat tip for supporting the underside of the circuit board; and (c) a magnetic means located at the base of the support means for holding the support means on the tooling platen.

5. The circuit board support assembly as claimed in claim 4 in which the tooling platen comprises ferro-magnetic metal.

6. The circuit board support assembly as claimed in claim 4 in which the conveying means comprises:

(a) a tooling pin holder having (1) an annular iron core, the annular iron core having a conical lead-in portion and a conical bore portion, the conical bore portion extending from the conical lead-in portion and mating with the support means, and (2) an electromagnetic coil surrounding the annular iron core, the electromagnetic coil becoming de-energized to release the support means onto the tooling platen.

7. The circuit board assembly as claimed in claim 1 in which the conveying means comprises:

(a) a video camera head for monitoring the X, Y position of the support means placed on the tooling platen, the video camera head being movable in the X, Y directions above the tooling platen.

8. A circuit board support assembly for supporting a circuit board during an operation performed on the board, the support assembly comprising:

(a) a tooling platen;

(b) a magazine having a plurality of pockets;

(c) a plurality of support pins positioned within the pockets, the support pins having a magnetic means located at the base of the support pins for holding the support pins on the tooling platen;

(d) handling means for lifting the support pins from the pocket to the tooling platen; and (e) a conveying means for conveying the support pins to a position on the tooling platen.

9. The circuit board support assembly as claimed in claim 8 in which the magazine is a carousel.

10. A circuit board support assembly for supporting a circuit board during an operation performed on the board, the support assembly comprising:

(a) a tooling platen;

(b) a carousel having a plurality of pockets, the pockets for retaining removable support means;

(c) a handling means for lifting the support means from the pocket to the tooling platen; and (d) a conveying means for conveying the support means to a position on the tooling platen.

* * * * *